US012666992B2

(12) United States Patent
Chen et al.

(10) Patent No.: US 12,666,992 B2
(45) Date of Patent: Jun. 23, 2026

(54) CIRCUIT BOARD WITH EMBEDDED CHIP AND METHOD OF MANUFACTURING THE SAME

(71) Applicant: Unimicron Technology Corp., Taoyuan (TW)

(72) Inventors: Yu-Shen Chen, Taoyuan (TW); I-Ta Tsai, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 807 days.

(21) Appl. No.: 18/053,379

(22) Filed: Nov. 8, 2022

(65) Prior Publication Data

US 2024/0105661 A1     Mar. 28, 2024

(30) Foreign Application Priority Data

Sep. 22, 2022     (TW) ................................. 111135988

(51) Int. Cl.
H10W 74/01        (2026.01)
H10W 70/05        (2026.01)
(Continued)

(52) U.S. Cl.
CPC ......... H10W 74/019 (2026.01); H10W 70/05 (2026.01); H10W 70/685 (2026.01);
(Continued)

(58) Field of Classification Search
CPC . H01L 23/3185; H01L 23/3157; H01L 21/56; H01L 21/563; H01L 21/568;
(Continued)

(56) References Cited

U.S. PATENT DOCUMENTS 11,310,911 B2      4/2022  Song et al.
2004/0145051 A1*   7/2004  Klein ..................... H10W 72/00
                                                       257/734
(Continued)

FOREIGN PATENT DOCUMENTS

CN          110310937 A      10/2019
CN          112188731 A       1/2021
(Continued)

*Primary Examiner* — Wael M Fahmy

*Assistant Examiner* — Quinton A Brasfield

(74) *Attorney, Agent, or Firm* — CKC & Partners Co., LLC

(57)     ABSTRACT

The present disclosure provides a circuit board with an embedded chip, which includes a dielectric layer, a first circuit layer, a chip, a conductive connector, and an insulating protection layer. The first circuit layer includes at least one first trace in the dielectric layer. The chip is in the dielectric layer and adjacent to the first trace, where the chip includes a plurality of chip pads at an upper surface of the chip. The conductive connector is on the upper surface of the chip and on the first circuit layer, where a lower surface of the conductive connector contacts at least one chip pad of the chip pads and an upper surface of the first trace. The insulating protection layer is on the chip, the first circuit layer, and the conductive connector, where the insulating protection layer contacts the upper surface of the chip.

20 Claims, 21 Drawing Sheets

(51) Int. Cl.

| | |
|---|---|
| *H10W 70/60* | (2026.01) |
| *H10W 70/652* | (2026.01) |
| *H10W 70/655* | (2026.01) |
| *H10W 70/685* | (2026.01) |
| *H10W 72/00* | (2026.01) |
| *H10W 72/90* | (2026.01) |
| *H10W 74/10* | (2026.01) |
| *H10W 90/00* | (2026.01) |
| *H10W 90/10* | (2026.01) |

(52) U.S. Cl.
CPC .......... *H10W 74/114* (2026.01); *H10W 90/00* (2026.01); *H10W 70/093* (2026.01); *H10W 70/60* (2026.01); *H10W 70/6528* (2026.01); *H10W 70/655* (2026.01); *H10W 72/823* (2026.01); *H10W 72/932* (2026.01); *H10W 72/9445* (2026.01); *H10W 90/10* (2026.01); *H10W 90/722* (2026.01); *H10W 90/724* (2026.01)

(58) Field of Classification Search
CPC ........... H01L 23/5389; H01L 24/19–20; H01L 2224/19–22505; H01L 2224/25171; H01L 2224/28105; H01L 2224/254; H01L 2224/214; H01L 21/6835; H01L 21/3121; H05K 1/185; H05K 3/4682; H10W 70/00–098; H10W 70/60; H10W 70/654–656; H10W 70/6565; H10W 74/00–481; H10W 76/60–67; H10W 42/20–287; H10W 42/121; H10W 90/10; H10W 90/15; H10W 90/155; H10W 90/723; H10W 90/725; H10W 90/727; H10W 90/729; H10W 90/733; H10W 90/735; H10W 90/737; H10W 90/739; H10W 90/753; H10W 90/755; H10W 90/757; H10W 90/759; H10W 72/823; H10W 72/30–387; H10W 72/013–01371; H10W 90/731

See application file for complete search history.

(56) References Cited

U.S. PATENT DOCUMENTS

| | | | | |
|---|---|---|---|---|
| 2009/0039523 | A1* | 2/2009 | Jiang | H10W 74/014 |
| | | | | 257/777 |
| 2009/0302448 | A1* | 12/2009 | Huang | H10W 70/09 |
| | | | | 257/737 |
| 2014/0210054 | A1* | 7/2014 | Kosub | H10P 54/00 |
| | | | | 438/114 |
| 2020/0243461 | A1* | 7/2020 | Chiang | H10P 72/74 |
| 2021/0057300 | A1* | 2/2021 | You | H10P 72/74 |
| 2021/0104809 | A1* | 4/2021 | Lee | H01Q 1/2283 |
| 2022/0115350 | A1* | 4/2022 | Mun | H10P 72/74 |
| 2022/0130798 | A1 | 4/2022 | Hong et al. | |
| 2022/0230912 | A1 | 7/2022 | Kim et al. | |
| 2022/0230980 | A1* | 7/2022 | Hu | H10P 72/74 |

FOREIGN PATENT DOCUMENTS

| | | |
|---|---|---|
| CN | 114551422 A | 5/2022 |
| TW | 201801262 A | 1/2018 |

* cited by examiner

CIRCUIT BOARD WITH EMBEDDED CHIP AND METHOD OF MANUFACTURING THE SAME

CROSS-REFERENCE TO RELATED APPLICATION

This application claims priority to Taiwan Application Serial Number 111135988, filed Sep. 22, 2022, which is herein incorporated by reference in its entirety.

BACKGROUND

Field of Invention

The present disclosure relates to a circuit board and a method of manufacturing the same. More particularly, the present disclosure relates to a circuit board with an embedded chip and a method of manufacturing the same.

Description of Related Art

With the trend of electronic devices becoming thinner and lighter, circuit boards in the devices also have more and more densely distributed functional components. However, the circuit board structures in the related art usually use multiple circuit layers as conductive paths between the functional components, thus making it difficult to further thin the circuit boards. In addition, electrically connecting the functional components through the multiple circuit layers also increases the number of boundaries that current signals pass through. As a result, signal losses are caused. In order to satisfy the current development trend of electronic devices, it is necessary to overcome the above problems to improve the signal transmission quality of the circuit boards in the related art.

SUMMARY

According to some embodiments of the present disclosure, a circuit board with an embedded chip is provided. The circuit board with the embedded chip includes a dielectric layer, a first circuit layer, a first chip, a first conductive connector, and an insulating protection layer. The first circuit layer includes at least one first trace in the dielectric layer. The first chip is in the dielectric layer and adjacent to the first trace. The first chip includes a plurality of first chip pads located at an upper surface of the first chip. The first conductive connector is on the upper surface of the first chip and an upper surface of the first trace. A lower surface of the first conductive connector contacts at least one of the first chip pads and the upper surface of the first trace. The insulating protection layer is on the first chip, the first circuit layer, and the first conductive connector. The insulating protection layer contacts the upper surface of the first chip.

In some embodiments, the first conductive connector contacts the dielectric layer between the first chip and the first trace.

In some embodiments, a thickness of the insulating protection layer is greater than a thickness of the first conductive connector.

In some embodiments, a sidewall of the first conductive connector is laterally separated from the first chip pad in contact with the first conductive connector.

In some embodiments, the upper surface of the first chip, the upper surface of the first trace, and an upper surface of the dielectric layer are coplanar with one another.

In some embodiments, the first conductive connector and the first trace include a same metallic material.

In some embodiments, the insulating protection layer includes an opening. The opening exposes at least one of the first chip pads.

In some embodiments, the circuit board with the embedded chip further includes a second chip located above the insulating protection layer. The second chip is electrically connected to the first chip by the first chip pad exposed by the opening.

In some embodiments, the circuit board with the embedded chip further includes a solder bump filled into the opening. The solder bump contacts the second chip and the first chip pad exposed by the opening.

In some embodiments, the insulating protection layer includes an opening. The opening exposes part of the first circuit layer.

In some embodiments, the circuit board with the embedded chip further includes a second chip and a second conductive connector. The second chip is located in the dielectric layer and adjacent to the first chip. The second chip includes a plurality of second chip pads at an upper surface of the second chip. The second conductive connector is on the upper surface of the first chip and on the upper surface of the second chip. A lower surface of the second conductive connector contacts the first chip pads of the first chip and the second chip pads of the second chip.

In some embodiments, a plurality of sidewalls of the second conductive connector are laterally separated from the first chip pads of the first chip and the second chip pads of the second chip.

In some embodiments, a boundary between the first chip and the second conductive connector is coplanar with a boundary between the second chip and the second conductive connector.

In some embodiments, the circuit board with the embedded chip further includes a second circuit layer under the dielectric layer. The second circuit layer is electrically connected to the first circuit layer through at least one blind via in the dielectric layer.

According to some embodiments of the present disclosure, a method of manufacturing a circuit board with an embedded chip is provided. The method includes the following steps: forming a first circuit layer and a chip on a substrate, in which the chip is adjacent to a first trace in the first circuit layer; forming a dielectric layer covering the first circuit layer and the chip; removing the substrate so that a plurality of chip pads at an upper surface of the chip and an upper surface of the first trace are exposed; forming a patterned photoresist on the upper surface of the chip and the upper surface of the first trace, in which the patterned photoresist includes at least one photoresist opening, the photoresist opening exposes at least one of the chip pads and part of the upper surface of the first trace; forming a conductive connector in the photoresist opening, in which the conductive connector contacts the exposed chip pad and the upper surface of the first trace; removing the patterned photoresist; and forming an insulating protection layer on the chip, the first circuit layer, and the conductive connector.

In some embodiments, forming the first circuit layer and the chip on the substrate includes the following steps: forming a release layer on the substrate and a metal layer on the release layer; forming the first circuit layer on the metal layer; and disposing the chip on the metal layer by an adhesive layer, in which the chip pads contact the adhesive layer.

In some embodiments, removing the substrate to expose the chip pads and the first trace includes the following steps: separating the release layer and the metal layer; removing the metal layer so that the upper surface of the first trace and the adhesive layer are exposed; and removing the adhesive layer so that the chip pads are exposed.

In some embodiments, the method further includes forming at least one opening in the insulating protection layer, in which the opening exposes the chip pads not covered by the conductive connector.

In some embodiments, the method further includes the following steps: patterning the dielectric layer after the dielectric layer is formed and before the substrate is removed to form at least one dielectric layer opening that exposes part of the first circuit layer; and depositing a conductive material on the dielectric layer and in the dielectric layer opening to form a second circuit layer and at least one blind via electrically connected to the first circuit layer.

In some embodiments, the method further includes the following steps: forming a photoresist layer on the dielectric layer, in which the photoresist layer covers the second circuit layer; and removing the photoresist layer when the patterned photoresist is removed.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
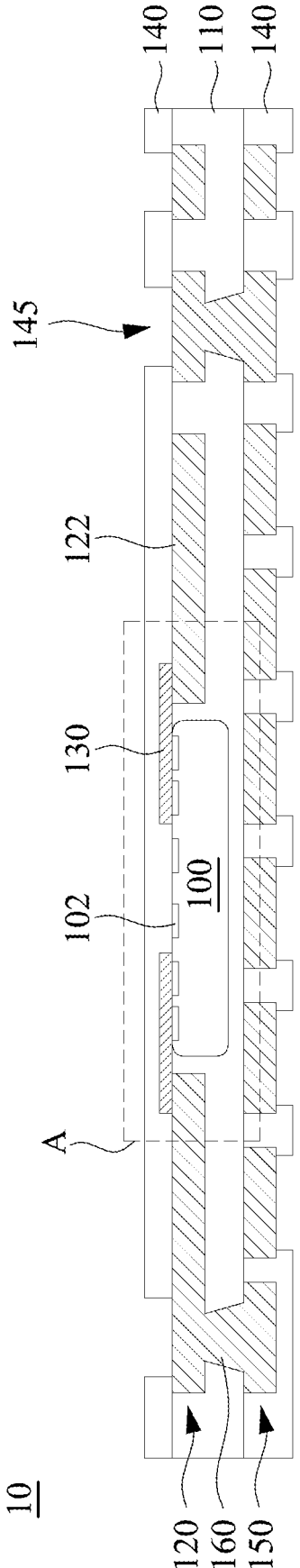
FIG. 1A depicts a cross-sectional view of a circuit board with an embedded chip according to some embodiments of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms first, second, third etc. may be used herein to describe various elements, components, regions, layers and/or parts, these elements, components, regions, layers and/or parts should not be limited by these terms. These terms are only used to distinguish one element, component, region, layer or part from another element, component, region, layer or part. Thus, a first element, component, region, layer or part discussed below could be termed a second element, component, region, layer or part without departing from the teachings of the present disclosure.

The present disclosure provides a circuit board with an embedded chip. The circuit board includes a first circuit layer and a chip in a dielectric layer, and a conductive connector on the chip and the first circuit layer. Since the conductive connector contacts a chip pad of the chip and a first trace of the first circuit layer, the chip and the first circuit layer can be electrically connected by the conductive connector at a same level. As a result, the conductive connector can reduce a number of boundaries between the chip and the first circuit layer, thus reducing losses or noises of current signals in the circuit board with the embedded chip.

Figure 1B:
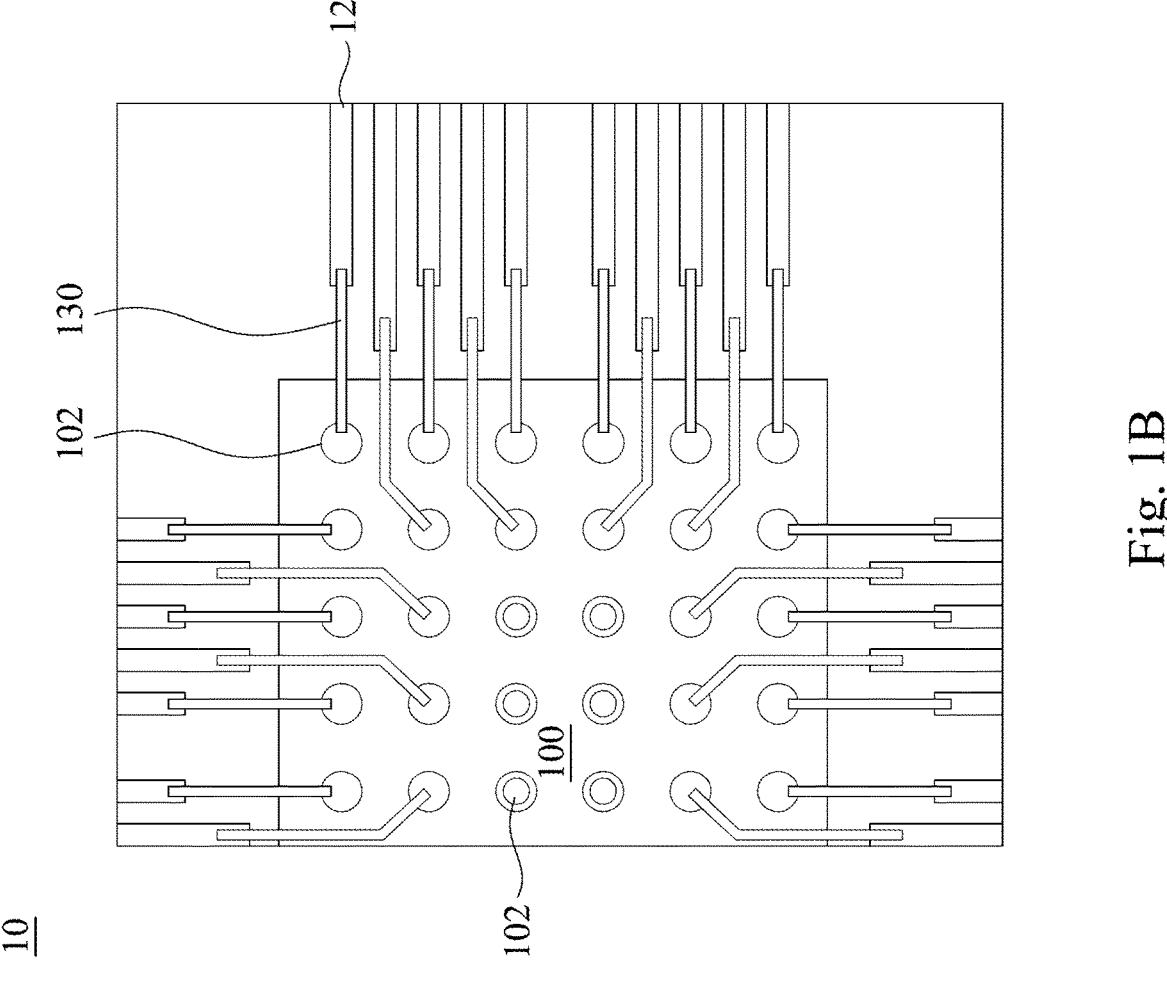
FIG. 1B depicts a schematic top view of the circuit board in FIG. 1A.
Figure 1C:
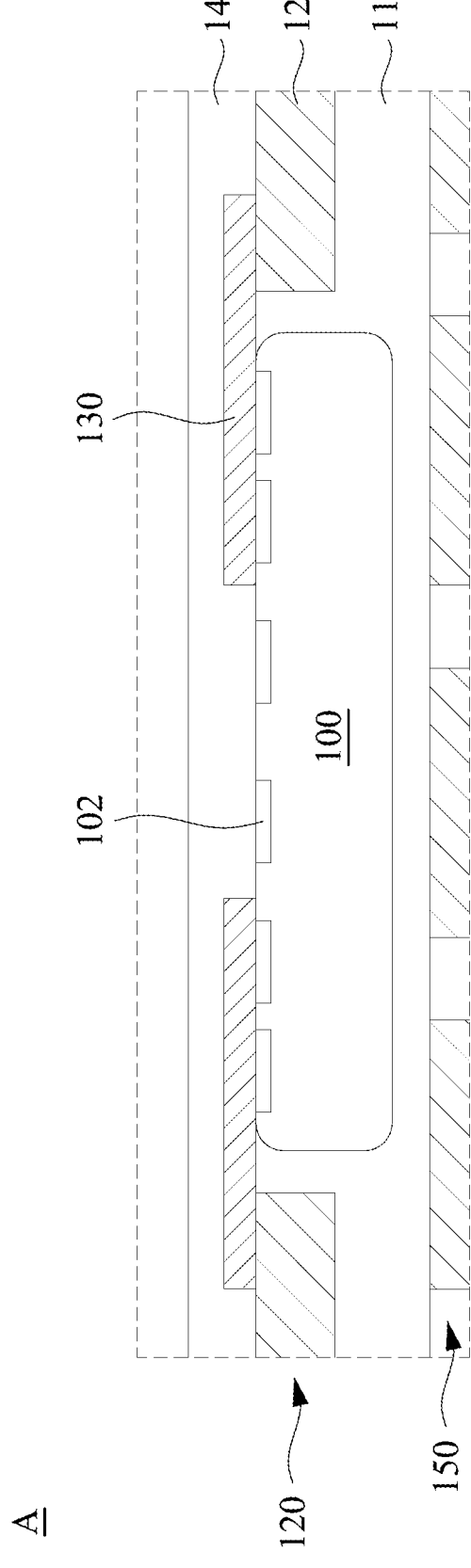
FIG. 1C depicts a partial enlarged view of the circuit board in FIG. 1A.

According to some embodiments of the present disclosure, FIG. 1A to FIG. 1C depict various views of a circuit board 10 with an embedded chip. In greater detail, FIG. 1A depicts a cross-sectional view of the circuit board 10, FIG. 1B depicts a schematic top view of the circuit board 10, and FIG. 1C depicts a partial enlarged view of an area A in FIG. 1A. In order to clearly describe the components included in the circuit board 10, only part of the components of the circuit board 10 are shown in FIG. 1A to FIG. 1C, however, a circuit board including additional components (such as a seed layer in a circuit layer, a system board electrically connected to a circuit board, etc.) are also within the scope of the present disclosure.

A description is provided with reference to FIG. 1A to FIG. 1C. The circuit board 10 includes a chip 100, a dielectric layer 110, a first circuit layer 120, a conductive connector 130, and an insulating protection layer 140. In greater detail, the chip 100 is in the dielectric layer 110 so that the dielectric layer 110 surrounds the chip 100. The chip 100 includes a plurality of chip pads 102 at an upper surface of the chip 100. For example, as shown in FIG. 1A, the upper surface of the chip 100 may be not lower than or coplanar with an upper surface of the dielectric layer 110, so that the dielectric layer 110 does not cover the chip pads 102 at the upper surface of the chip 100. In some embodiments, the dielectric layer 110 may cover a lower surface of the chip 100 so that the chip 100 can be electrically isolated from components on another side of the dielectric layer 110.

The first circuit layer 120 is located in the dielectric layer 110 so that the dielectric layer 110 surrounds the first circuit layer 120. In other words, the chip 100 and the first circuit layer 120 are both in the dielectric layer 110, and the dielectric layer 110 electrically isolates the chip 100 and the first circuit layer 120. Since the first circuit layer 120 and the chip 100 are in the same dielectric layer 110, the first circuit layer 120 and the chip 100 can be regarded as being located at a same level of the circuit board 10.

In greater detail, the chip 100 may be located between a plurality of conductive portions of the first circuit layer 120, so that a first trace 122 of the first circuit layer 120 is adjacent to the chip 100. The dielectric layer 110 electrically isolates the adjacent chip 100 and first trace 122. That is, the dielectric layer 110 is included between a sidewall of the first trace 122 and a sidewall of the chip 100. In some examples, the chip 100 adjacent to the first trace 122 may be referred to as an embedded chip. In some embodiments, the upper surface of the chip 100 may be coplanar with the upper surface of the first trace 122 and the upper surface of the dielectric layer 110, so that the chip 100, the first trace 122, and the dielectric layer 110 collectively form a flat upper surface.

The conductive connector 130 is on the upper surface of the chip 100 and is on an upper surface of the first circuit layer 120. In greater detail, the conductive connector 130 is located on multiple chip pads 102 of the chip 100 and the first trace 122 of the first circuit layer 120. As shown in FIG. 1C, the conductive connector 130 is directly located on the chip pads 102 and the first trace 122, so that a lower surface of the conductive connector 130 directly contacts the chip pads 102 and the upper surface of the first trace 122. Since the conductive connector 130 contacts the chip pads 102 and the first trace 122, the conductive connector 130 can serve as a conductive path to electrically connect the chip 100 and the first circuit layer 120. In some embodiments, the conductive connector 130 may include a seed layer (not shown in the figure) in contact with the chip pads 102 and the first trace 122.

The chip 100, the first circuit layer 120, and the conductive connector 130 that serves as the conductive path can be regarded as being located at the same level of the circuit board 10. In greater detail, the chip 100 and the first circuit layer 120 are in the same dielectric layer 110. The conductive connector 130 is directly formed on the chip 100 and the first circuit layer 120, so that no additional dielectric layer is included between the conductive connector 130 and the chip 100 or the first circuit layer 120. In other words, the conductive connector 130 and the chip 100 or the first circuit layer 120 are not separated by a dielectric layer to become components at different levels.

As a result, although the chip 100, the first circuit layer 120, and the conductive connector 130 have up-down dislocation relationships, they are still circuit components located at the same level. The chip 100 and the first circuit layer 120 can be electrically connected by the conductive connector 130 at the same level without the need of another circuit layer at another level.

The conductive connector 130 electrically connects the chip 100 and the first circuit layer 120, so that a number of boundaries that a current between the chip 100 and the first circuit layer 120 needs to pass through can be reduced. For example, when the current flows from the chip 100 to the first circuit layer 120, the current only needs to pass through a boundary between the chip pads 102 and the conductive connector 130 and a boundary between the first trace 122 and the conductive connector 130. Therefore, the conductive connector 130 can reduce the number of boundaries between the components, thus reducing losses or noises during current signal transmission.

In addition, using the conductive connector 130 to electrically connect the chip 100 and the first circuit layer 120 can also reduce a thickness of the circuit board 10. Because the chip 100 and the first circuit layer 120 are electrically connected by the conductive connector 130 at the same level, there is no need to form an additional circuit layer above the chip 100. In other words, the chip 100, the first circuit layer 120, and the conductive connector 130 may be a topmost level of the circuit board 10. Not only does such a design embed the chip 100 into the first circuit layer 120, but it also reduces a number of circuit layers required for the chip 100, thus achieving the effect of thinning the circuit board 10.

In some embodiments, the conductive connector 130 may include a suitable conductive material, so as to optimize the signal transmission quality and efficiency between the conductive connector 130 and the chip pads 102 or between the conductive connector 130 and the first trace 122. For example, the conductive connector 130 and the first trace 122 may include a same metallic material to reduce a resistance difference between the conductive connector 130 and the first trace 122. For example, the conductive connector 130 and the first trace 122 may both be formed of a copper metal.

In some embodiments, the conductive connector 130 may have a continuous structure across the chip pads 102 and the first trace 122, so that the lower surface of the conductive connector 130 contacts the dielectric layer 110 between the chip 100 and the first trace 122. For example, as shown in FIG. 1C, the upper surfaces of the chip 100, the first trace 122, and the dielectric layer 110 are coplanar with one another. Therefore, the conductive connector 130 formed on the chip 100 and the first trace 122 can have the flat lower surface, and the lower surface of the conductive connector 130 contacts the dielectric layer 110 between the chip 100 and the first trace 122.

In some embodiments, the conductive connector 130 may completely cover at least one of the plurality of chip pads 102, so that a sidewall of the conductive connector 130 is laterally separated from the chip pad 102. Take FIG. 1C for example, in a horizontal direction of FIG. 1C, the sidewall of the conductive connector 130 and the chip pad 102 are separated from each other. As shown in FIG. 1C, the sidewall of the conductive connector 130 is located between two of the chip pads 102, so that the conductive connector 130 completely covers the chip pads 102 closer to the first trace 122.

In some other embodiments, the conductive connector 130 may cover a part of a single chip pad 102. As shown in FIG. 1B, a width of the conductive connector 130 may be smaller than a diameter of the chip pad 102 or a width of the first trace 122, so that the conductive connector 130 only covers part of the chip pad 102 or the first trace 122. In such embodiments, the conductive connector 130 can connect the corresponding chip pad 102 and first trace 122, as well as avoiding unwanted conductive paths generated with the adjacent chip pads 102 or first trace 122. Additionally, the circuit board 10 may include a plurality of conductive connectors 130, and each of the conductive connectors 130 may be a wire, as shown in FIG. 1B.

As mentioned previously, the conductive connector 130 electrically connects the chip 100 and the first circuit layer 120, so that the chip 100 can be located at the topmost level of the circuit board 10. Hence, the insulating protection layer 140 located on an outermost side of the circuit board 10 may be directly formed on the chip 100, the first circuit layer 120, and the conductive connector 130. As shown in FIG. 1C, the insulating protection layer 140 may directly contact the upper surface of the chip 100, the upper surface and side-walls of the conductive connector 130, the upper surface of the first trace 122, and the upper surface of the dielectric layer 110.

In some embodiments, the conductive connector 130 on the chip 100 may cover part of the plurality of chip pads 102, and the insulating protection layer 140 covers the remaining chip pads 102. In other words, all the chip pads 102 of the chip 100 can be covered by the conductive connector 130 and the insulating protection layer 140. Similarly, the con-ductive connector 130 may cover part of the upper surface of the first trace 122, and the upper surface of the first trace 122 not covered by the conductive connector 130 contacts a lower surface of the insulating protection layer 140.

In some embodiments, a thickness of the insulating pro-tection layer 140 may be greater than a thickness of the conductive connector 130, so that the whole conductive connector 130 is covered by the insulating protection layer 140. Therefore, not only can the insulating protection layer 140 protect the chip 100 and the first circuit layer 120 in the dielectric layer 110, but it also can maintain the stability of the conductive connector 130.

In some embodiments, the insulating protection layer 140 may include an opening 145 right above the first circuit layer 120. The opening 145 exposes part of the first circuit layer 120 so that the first circuit layer 120 can be electrically connected to another circuit board or component. For example, the insulating protection layer 140 may be a solder mask, and the opening 145 is a position where a solder bump will be formed. When the solder bump is formed in the opening 145, the insulating protection layer 140 can provide a solder resisting function for the underlying chip 100 and first circuit layer 120, and the first circuit layer 120 exposed by the opening 145 can be electrically connected to the component above it by the solder bump.

In some embodiments, the insulating protection layers 140 may be formed on two sides of the dielectric layer 110. As shown in FIG. 1A, the circuit board 10 may include a second circuit layer 150 under the dielectric layer 110 and at least one blind via 160 in the dielectric layer 110. The second circuit layer 150 and the first circuit layer 120 can be electrically connected to each other through the dielectric layer 110 by a conductive path formed by the at least one blind via 160. Since the second circuit layer 150 is formed outside the dielectric layer 110, the insulating protection layer 140 and the dielectric layer 110 can sandwich the second circuit layer 150 to protect the second circuit layer 150. In some embodiments, the second circuit layer 150 and the blind via 160 may be integrally formed into one piece so as to minimize losses of a current signal between the second circuit layer 150 and the blind via 160.

Figure 2:
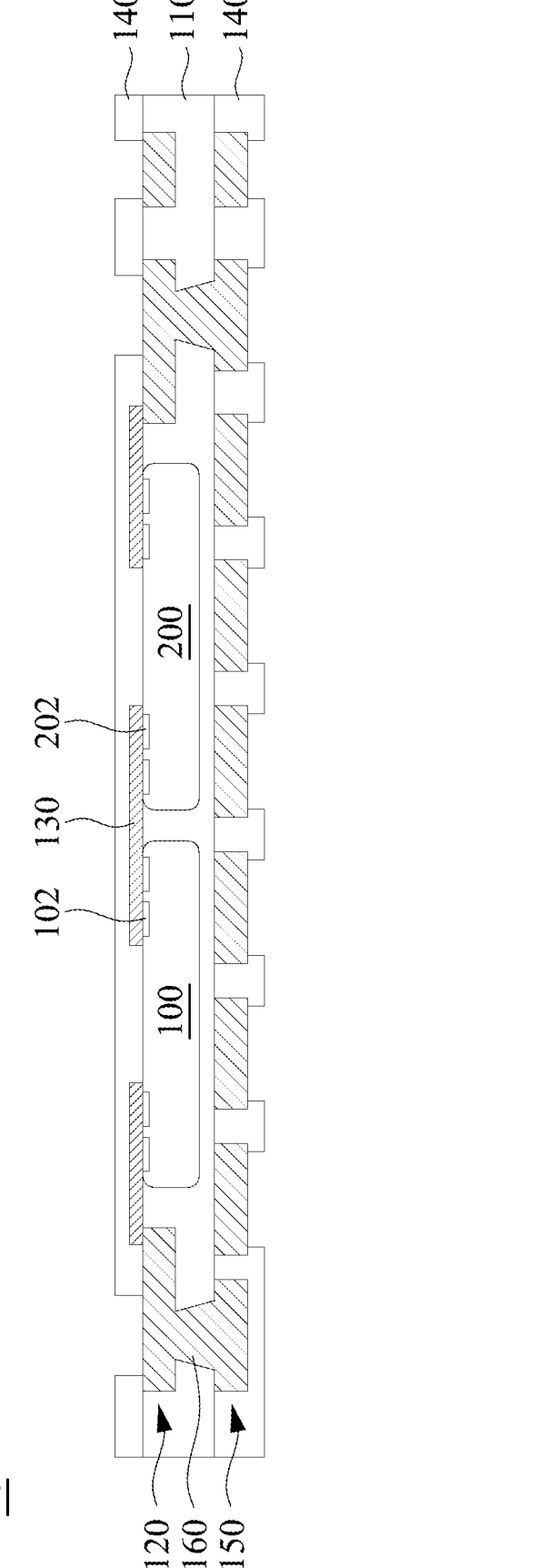
FIG. 2 depicts a cross-sectional view of a circuit board with an embedded chip according to some embodiments of the present disclosure.

According to some embodiments of the present disclo-sure, FIG. 2 depicts a cross-sectional view of a circuit board 20 with an embedded chip to illustrate another application method of the circuit board of the present disclosure. The circuit board 20 is similar to the circuit board 10 in structure, except that the circuit board 10 includes the single chip 100, whereas the circuit board 20 includes the chip 100 and a chip 200.

In greater detail, the chip 200 of the circuit board 20 is in the dielectric layer 110 and adjacent to the chip 100. The dielectric layer 110 surrounds the chip 200 to electrically isolate the chip 100 and the chip 200. The chip 200 includes a plurality of chip pads 202 at an upper surface of the chip 200, and the dielectric layer 110 does not cover the chip pads 202.

The conductive connector 130 is on an upper surface of the chip 100 and on the upper surface of the chip 200. As shown in FIG. 2, the conductive connector 130 is directly located on the chip pads 102 and the chip pads 202, so that a lower surface of the conductive connector 130 directly contacts the chip pads 102 and the chip pads 202.

Since the conductive connector 130 directly electrically connects a plurality of chips (for example, the chip 100 and the chip 200) in the same dielectric layer 110, a conductive path from the chip 100 to the chip 200 can include a small number of boundaries. For example, when connection is performed according to the embodiment shown in FIG. 2, a current only needs to pass through a boundary between the chip pads 102 and the conductive connector 130 and a boundary between the chip pads 202 and the conductive connector 130. Such connection method can reduce a num-ber of the boundaries passed through by the chip-to-chip connection, thus reducing losses or noises during signal transmission and increasing the application flexibility of the embedded chips.

In some embodiments, the conductive connector 130 may completely cover at least one of the plurality of chip pads 102 and at least one of the plurality of chip pads 202, so that one of sidewalls of the conductive connector 130 is laterally separated from the chip pad 102 and the other one of the sidewalls of the conductive connector 130 is laterally sepa-rated from the chip pad 202. As shown in FIG. 2, one part of the conductive connector 130 (such as the left half of the conductive connector 130 in FIG. 2) extends across the two chip pads 102 and another part of the conductive connector 130 (such as the right half of the conductive connector 130 in FIG. 2) extends across the two chip pads 102, so that the conductive connector 130 completely covers the chip pads 102 and the chip pads 202 close to a gap between the chip 100 and the chip 200.

In some embodiments, the upper surface of the chip 100, the upper surface of the chip 200, and the upper surface of the dielectric layer 110 may be coplanar with one another, so that the conductive connector 130 can have the flat lower surface. In other words, a boundary between the chip 100 and the conductive connector 130 can be coplanar with a boundary between the chip 200 and the conductive connec-tor 130.

Figure 3A:
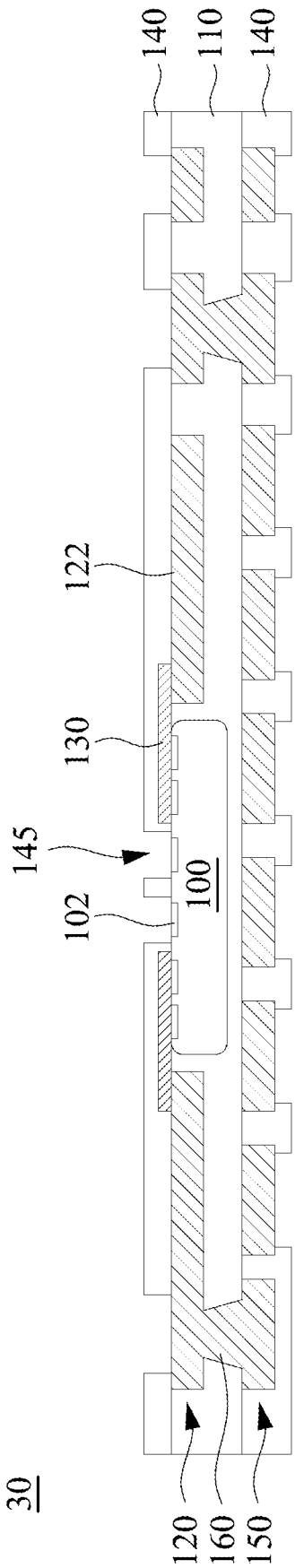
FIG. 3A depicts a cross-sectional view of a circuit board with an embedded chip according to some embodiments of the present disclosure.
Figure 3B:
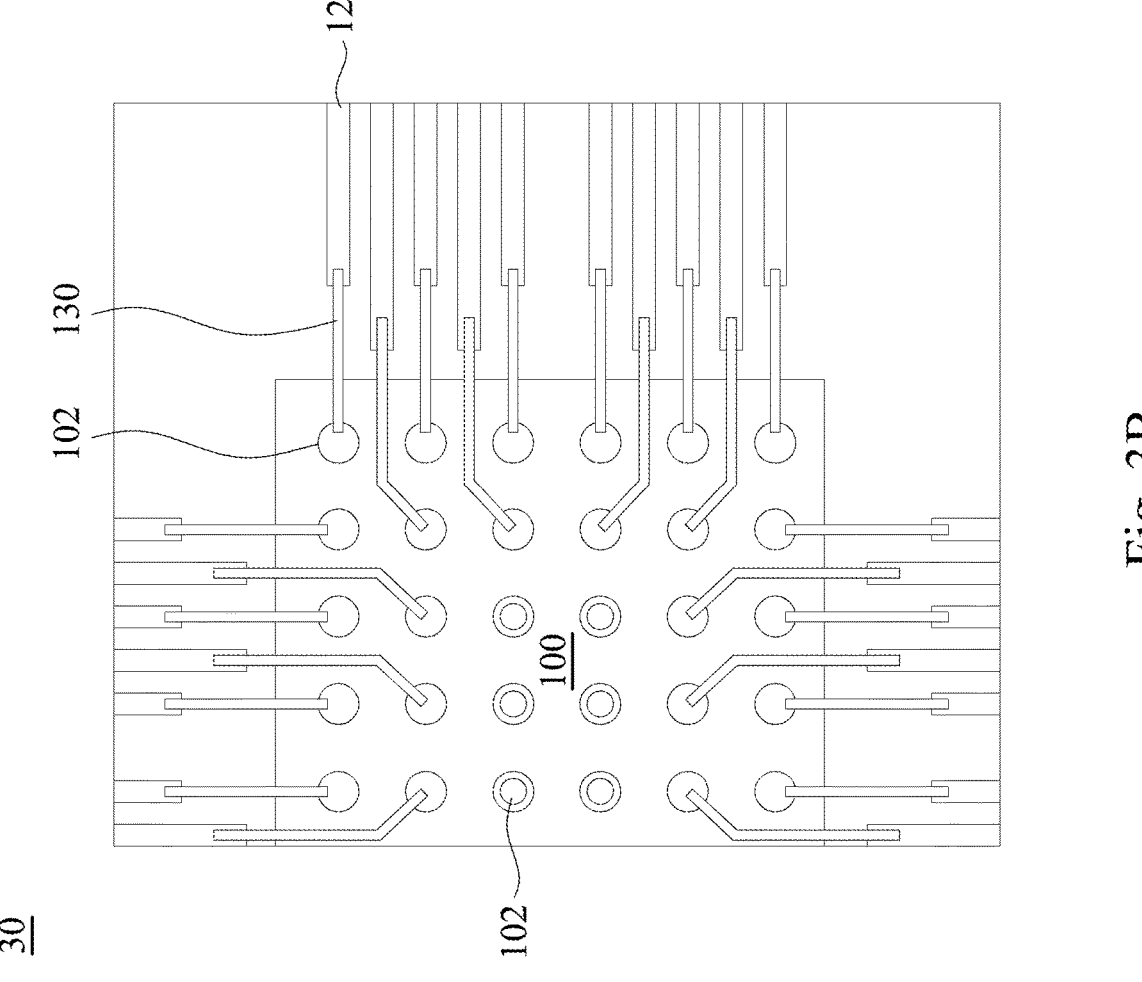
FIG. 3B depicts a schematic top view of the circuit board in FIG. 3A.

According to some embodiments of the present disclo-sure, FIG. 3A to FIG. 3B depict various views of a circuit board 30 with an embedded chip to illustrate another appli-cation method of the circuit board of the present disclosure. In greater detail, FIG. 3A depicts a cross-sectional view of the circuit board 30, and FIG. 3B depicts a schematic top view of the circuit board 30. The circuit board 30 is similar to the circuit board 10 in structure, except that the circuit board 10 uses the insulating protection layer 140 to cover the chip pads 102, whereas the circuit board 30 exposes part of the chip pads 102.

In greater detail, the insulating protection layer 140 of the circuit board 30 includes a plurality of openings 145. At least one of the openings 145 is right above the chip 100. As shown in FIG. 3A and FIG. 3B, the conductive connector 130 covers part of the chip pads 102, and the opening 145 can expose the chip pads 102 not covered by the conductive connector 130. Since the chip 100 is at a topmost level of the circuit board 30, the chip 100 can be electrically connected to another circuit board or component above the circuit board 30 through the chip pads 102 without using an additional circuit layer at another level. The advantages of this board design are described below with reference to FIG. 4.

Figure 4:
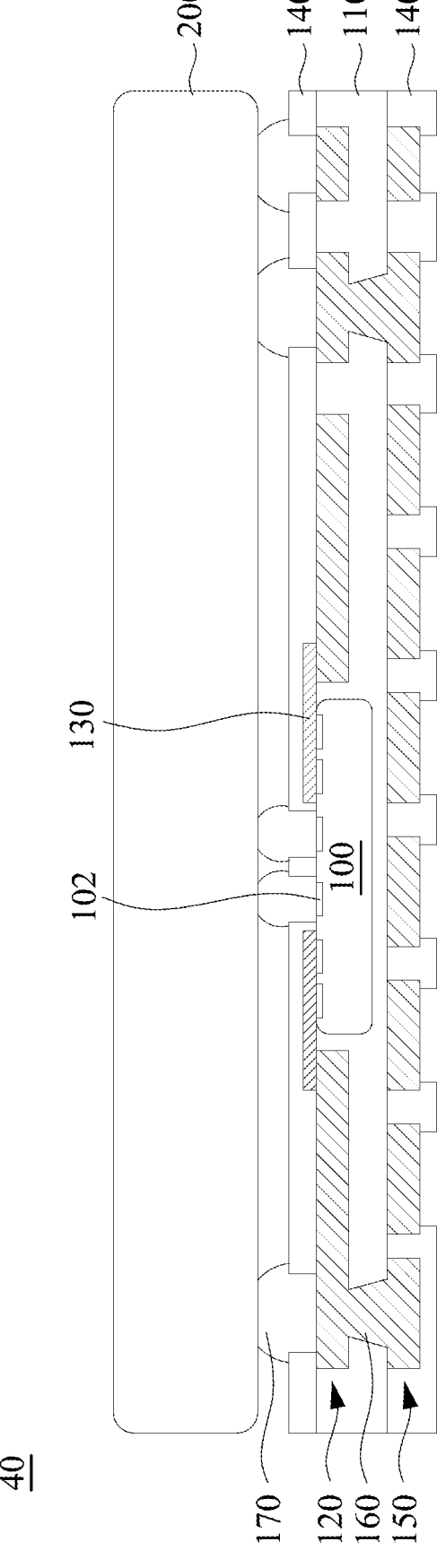
FIG. 4 depicts a cross-sectional view of a circuit board with an embedded chip according to some embodiments of the present disclosure.

According to some embodiments of the present disclosure, FIG. 4 depicts a cross-sectional view of a circuit board 40 with an embedded chip to illustrate another application method of the circuit board of the present disclosure. The circuit board 40 is similar to the circuit board 30 in structure, except that the circuit board 40 further includes the chip 200 above the chip 100.

The chip 200 is located above the insulating protection layer 140 so that the chip 100 is spaced apart from the chip 200. An opening in the insulating protection layer 140 (such as the opening 145 shown in FIG. 3A) exposes part of the chip pads 102, and the chip 200 is electrically connected to the chip 100 by the exposed chip pads 102. For example, the openings 145 in the insulating protection layer 140 may be filled with solder bumps 170, so that the solder bumps 170 contact the chip 200 and the chip pads 102.

Because the conductive connector 130 directly electrically connects the chip 100 and the first circuit layer 120 in the same dielectric layer 110, the chip 100 can be located at a level only next to the chip 200 in the circuit board 40. Therefore, not only does the insulating protection layer 140 contact an upper surface of the chip 100, but the opening 145 in the insulating protection layer 140 is also used to expose the chip pads 102 of the chip 100. In such embodiments, no additional circuit layer is required to perform electrical connection between the chip 100 and the chip 200, so that a conductive path from the chip 100 to the chip 200 can include a small number of boundaries.

For example, when connection is performed according to the embodiment shown in FIG. 4, a current only needs to pass through boundaries between the chip pads 102 and the solder bumps 170 and boundaries between the chip 200 (or chip pads of the chip 200) and the solder bumps 170. Such connection method can reduce a number of the boundaries passed through by the chip-to-chip connection, thus reducing losses or noises during signal transmission and increasing the application flexibility of the embedded chips.

Figure 5A:
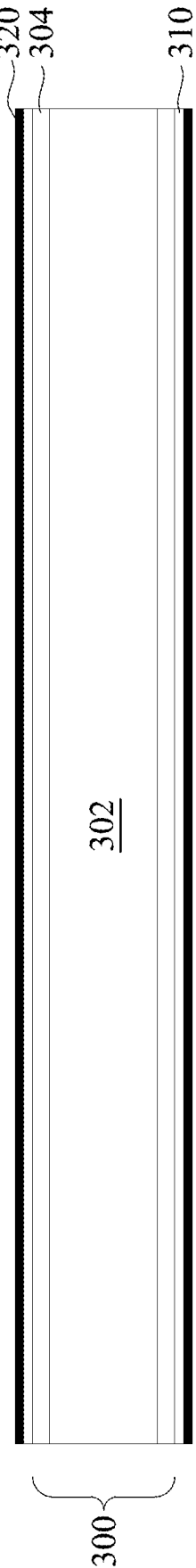
FIG. 5A to FIG. 5N depict cross-sectional views of a circuit board with an embedded chip at various intermediate stages of a manufacturing process according to some embodiments of the present disclosure.
Figure 5B:
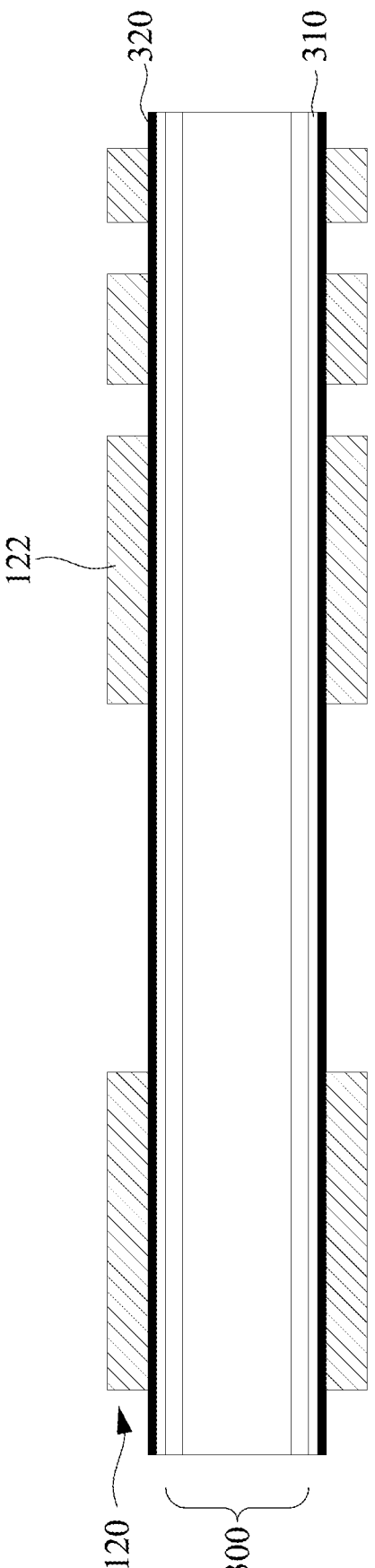
Figure 5C:
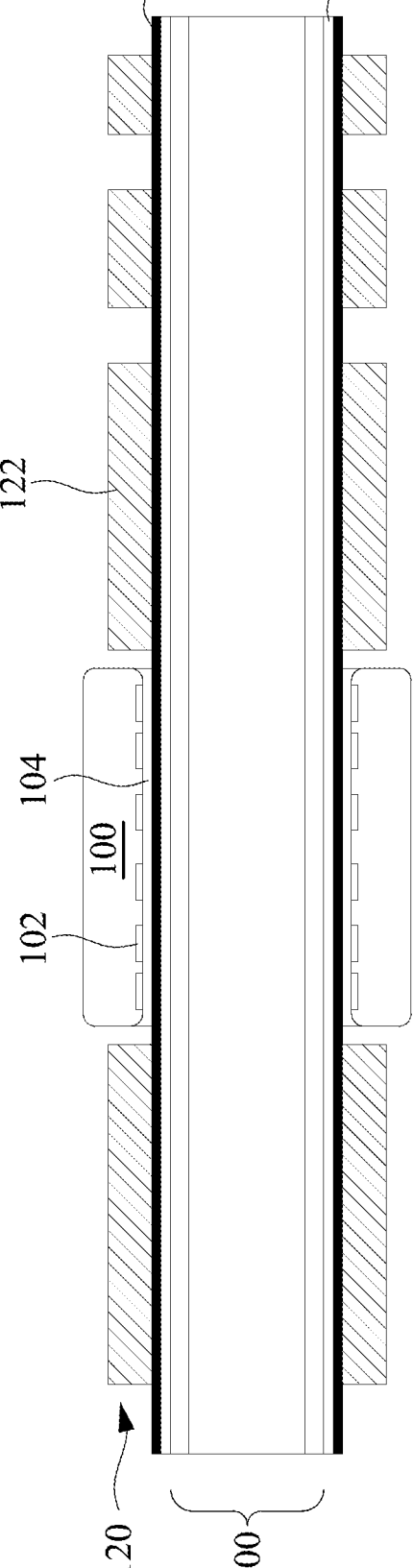
Figure 5D:
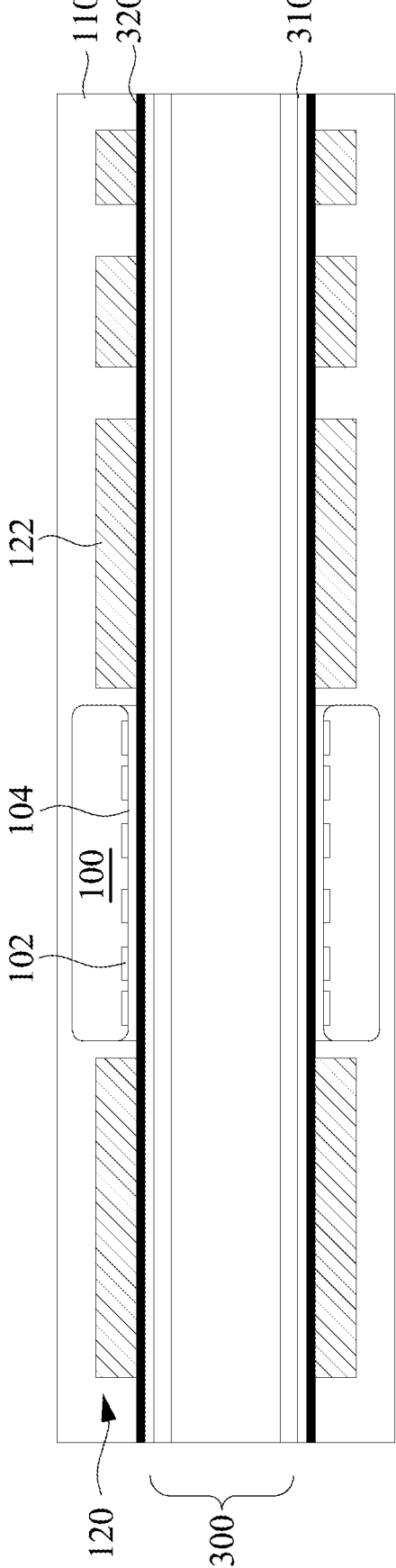
Figure 5E:
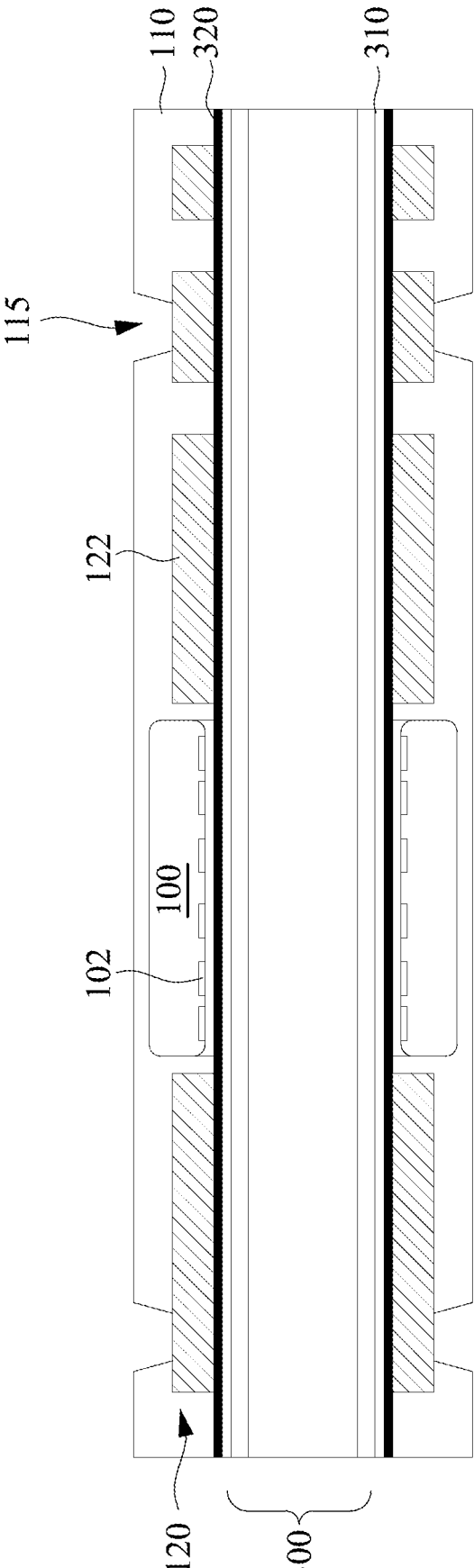
Figure 5F:
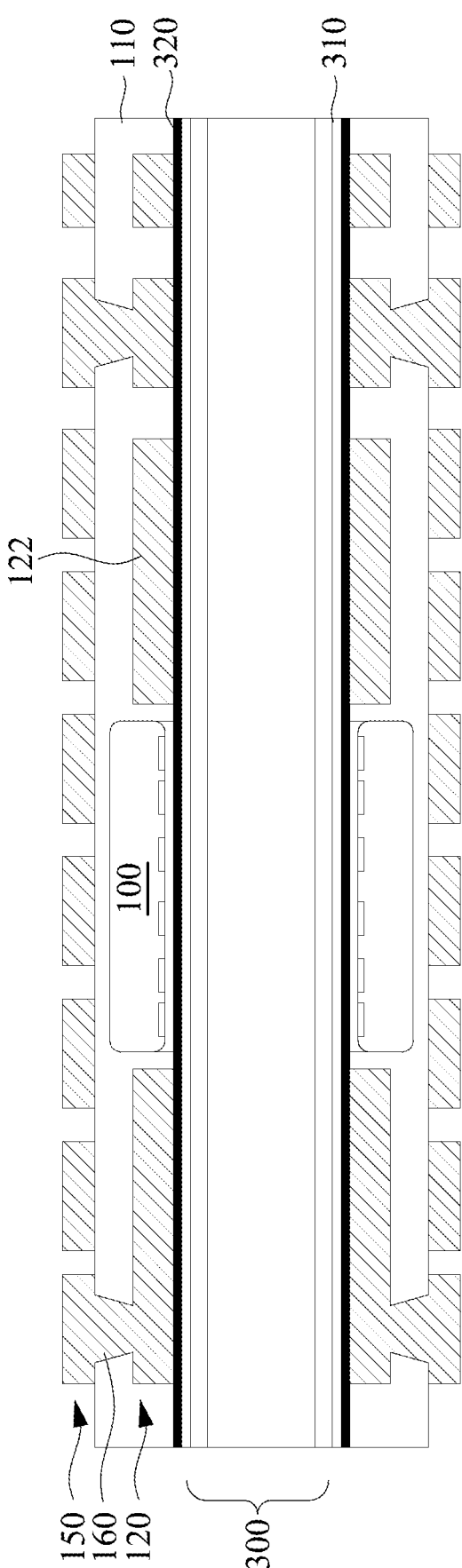
Figure 5G:
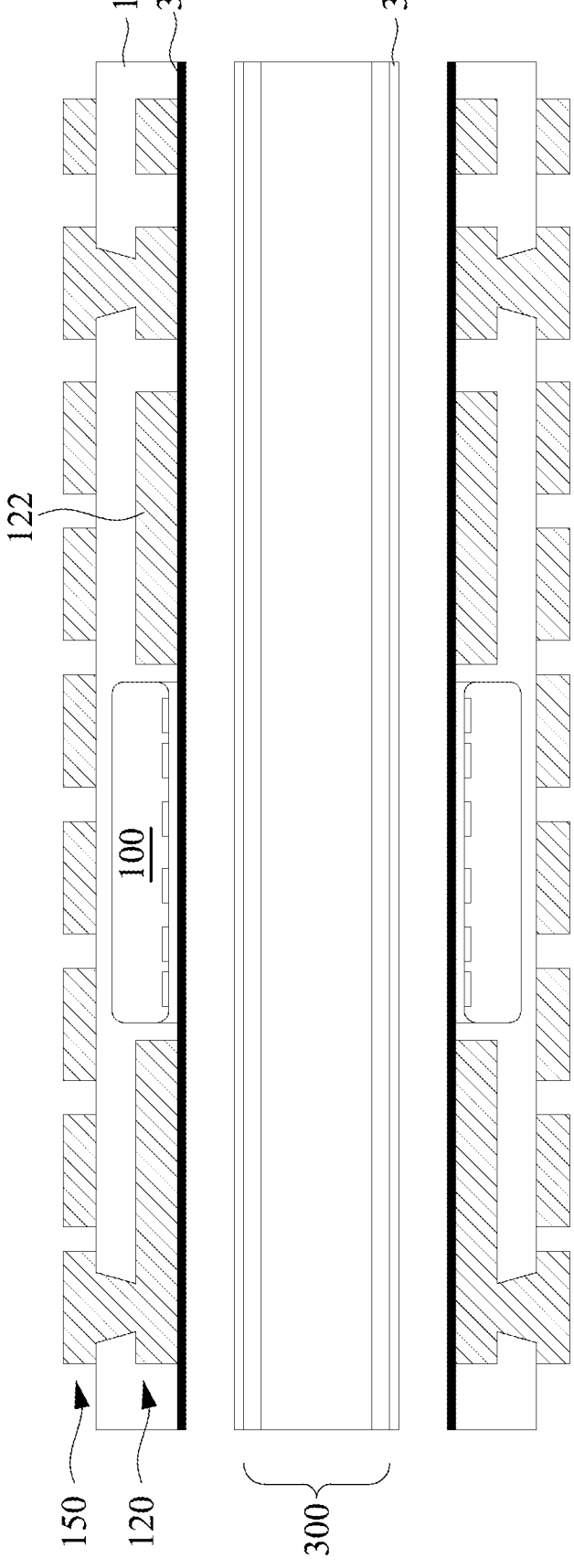
Figure 5H:
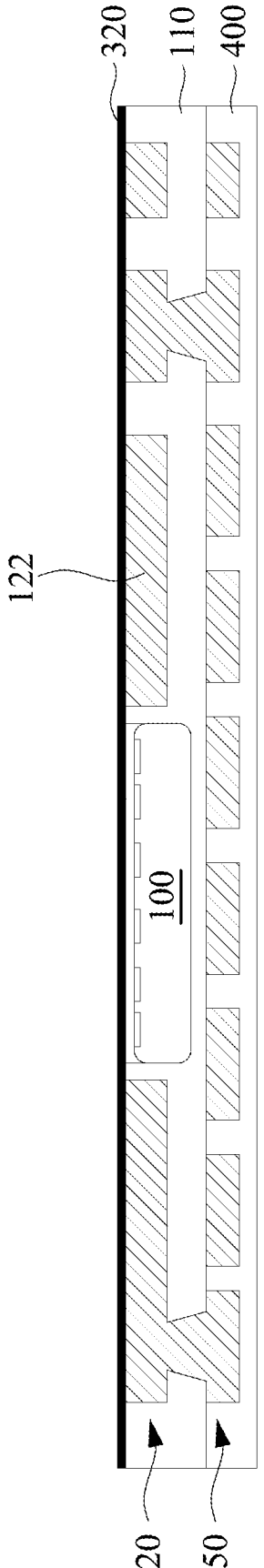
Figure 5I:
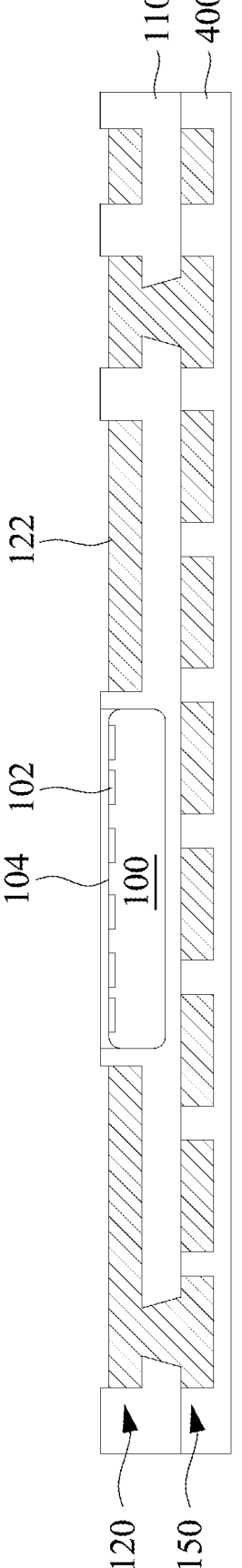
Figure 5J:
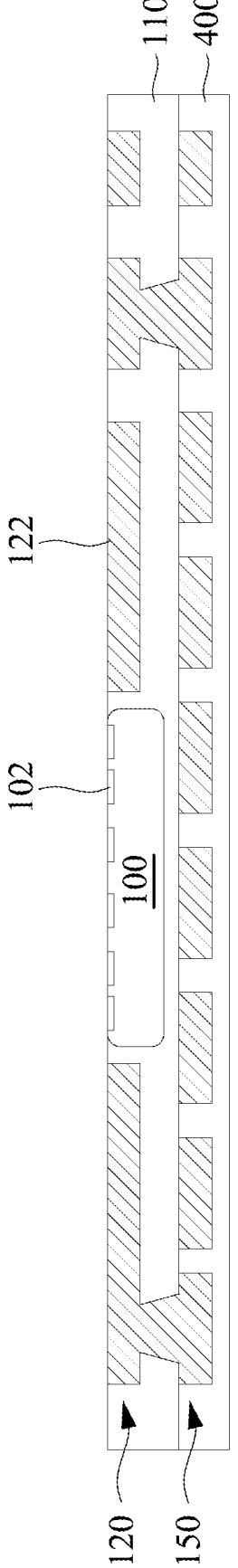
Figure 5K:
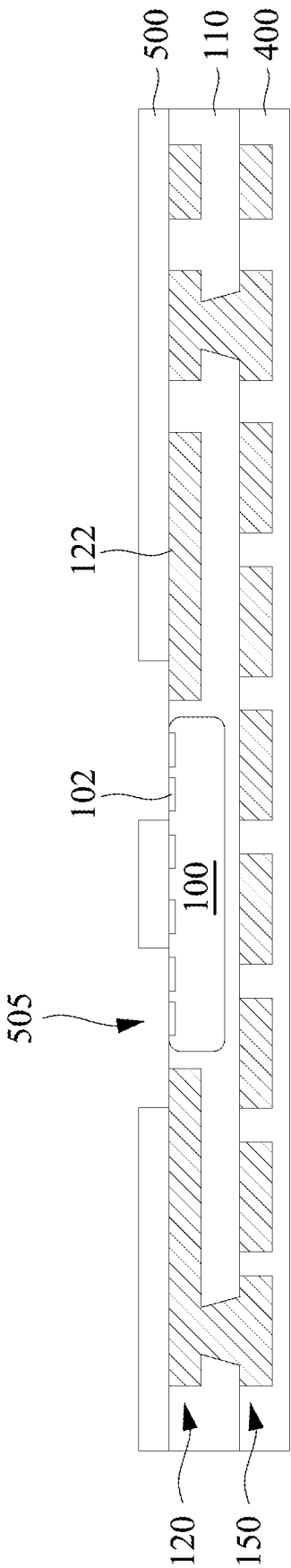
Figure 5L:
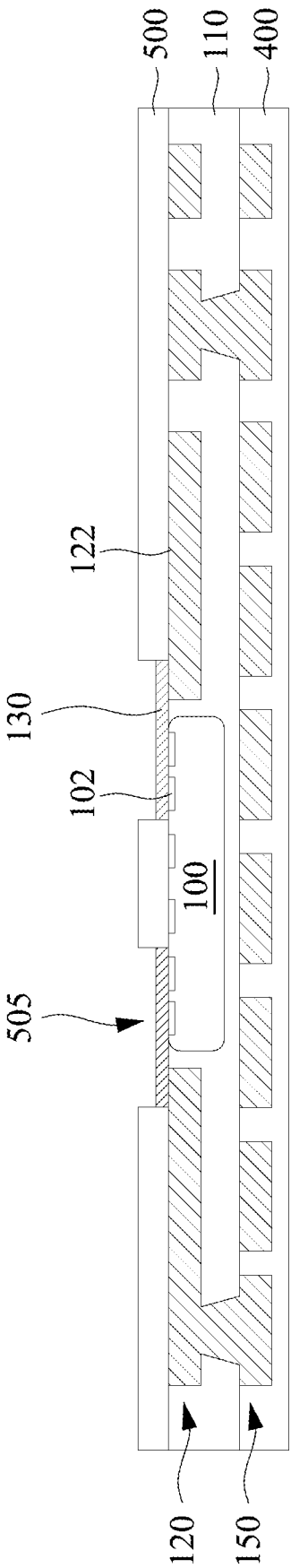
Figure 5M:
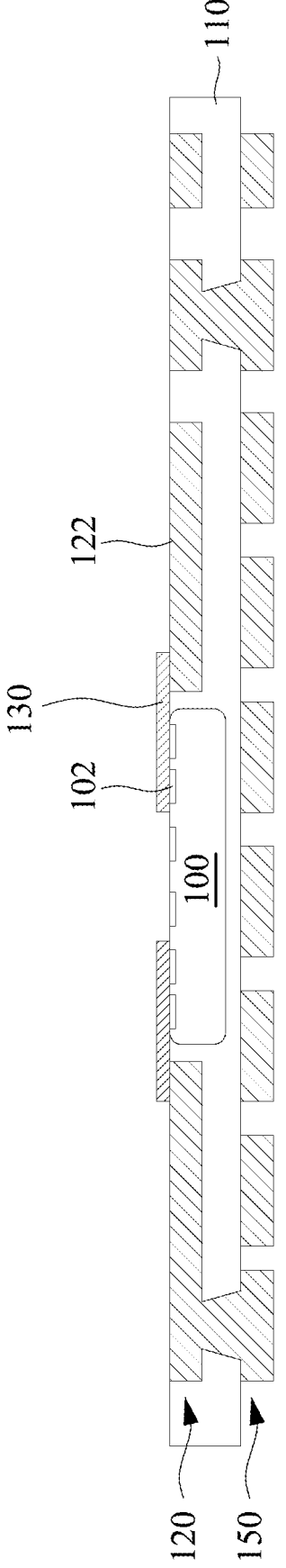
Figure 5N:
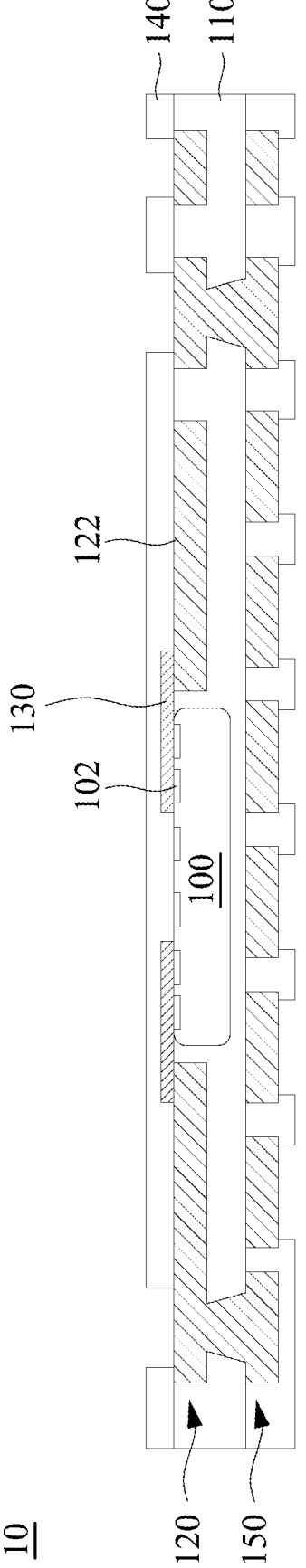

According to some embodiments of the present disclosure, FIG. 5A to FIG. 5N depict cross-sectional views of a circuit board at various intermediate stages of a manufacturing process. The manufacturing of the circuit board 10 shown in FIG. 1A is taken as an example to depict the method shown in FIG. 5 to FIG. 5N. However, those skilled in the art should understand that the method shown in FIG. 5A to FIG. 5N can not only be used to form the circuit board 10, but also can be used to form other circuit boards with embedded chips within the scope of the present disclosure.

It should be noted that, unless otherwise stated, when FIG. 5A to FIG. 5N illustrate or describe a series of steps of an embodiment, the description order of these steps should not be limited. For example, some steps may have a different order from those described in the embodiments, some steps may occur simultaneously, some steps may not be required, and/or some steps may be repeated. Furthermore, additional steps may be performed before, during, or after the steps depicted to completely form the circuit board.

A description is provided with reference to FIG. 5A to FIG. 5C. The first circuit layers 120 and the chips 100 are formed on the substrate 300. In greater detail, the substrate 300 serves a carrier substrate and is configured to accommodate the chips 100 and the first circuit layers 120. Since the first circuit layer 120 includes the first trace 122 and other conductive portions (such as a pad layer) separated from one another, the chip 100 can be formed adjacent to the first trace 122 and in the first circuit layer 120. In other words, the chip 100 and the first circuit layer 120 can be formed on a same surface of the substrate 300 so as to be located at a same level of the circuit board 10.

First, a description is provided with reference to FIG. 5A. In some embodiments, the substrate 300 may be a core layer. For example, the substrate 300 may include an insulating layer 302 and circuit layers 304 on two sides of the insulating layer 302. In such embodiments, when the first circuit layer 120 is formed on the substrate 300, the first circuit layer 120 can be electrically connected to the circuit layer 304 in the substrate 300. In some other embodiments, the substrate 300 may be a rigid substrate with a smooth surface so that subsequently formed components also have flat top surfaces. For example, the substrate 300 may be a glass substrate.

In some embodiments, as shown in FIG. 5A, release layers 310 may be formed on the substrate 300 before forming the first circuit layers 120. Components on two sides of the release layer 310 can be separated after the release layer 310 undergoes subsequent processing steps. It is thus helpful to separate the substrate 300 and the components on the other side of the release layer 310. For example, the release layers 310 can be separated from the subsequently formed first circuit layers 120 by, for example, illuminating or heating the release layers 310.

In some embodiments, the release layer 310 and the metal layer 320 may be laminated on the substrate 300 at the same time, so that the metal layer 320 covers the release layer 310. When subsequent conductive components (such as the first circuit layers 120 shown in FIG. 5B) are formed on the metal layer 320, the metal layer 320 can improve the integrity and stability of the conductive components. In some examples, the metal layer 320 may also be referred to as a seed layer. The metal layer 320 may be a metal thin film, and a type of metal contained in the metal layer 320 may be the same as or similar to a type of metal contained in the first circuit layer 120. For example, when the first circuit layer 120 includes copper metal, titanium/copper can be used as a material of the metal layer 320.

A description is provided with reference to FIG. 5B. In some embodiments, forming the first circuit layers 120 may include forming a metallic material of the first circuit layers 120 through a deposition process. For example, a copper metal layer or an alloy layer may be formed by using evaporation, sputtering, electroplating, some other suitable deposition technique, or a combination thereof. After the metallic material undergoes a patterning process or a patterned mask is used during the deposition process, the first circuit layers 120 can have a suitable pattern to form the first traces 122 and the other conductive portions.

A description is provided with reference to FIG. 5C. In some embodiments, forming the chips 100 on the substrate 300 may include using adhesive layers 104 to dispose the chips 100 on the substrate 300. For example, when the metal layer 320 is included on the substrate 300, the chip 100 may be disposed on the metal layer 320 by using the adhesive layer 104. It is noted that the adhesive layer 104 covers one side of the chip 100 including the chip pads 102, so that the chip pads 102 of the chip 100 contact the adhesive layer 104. In other words, the adhesive layer 104 can be located between the chip pads 102 and the metal layer 320.

A description is provided with reference to FIG. 5D. The dielectric layers 110 covering the first circuit layers 120 and the chips 100 are formed. In greater detail, a dielectric material is deposited on the first circuit layers 120 and the chips 100 to form the dielectric layers 110, in which the dielectric layer 110 and the substrate 300 are respectively located on opposite sides of the chip 100. A thickness of the dielectric layer 110 is greater than those of the chip 100 and the first circuit layer 120, so that the dielectric layers 110 cover the first circuit layers 120 and the chips 100. In addition, the dielectric layers 110 are also filled into gaps between the chips 100 and the first circuit layers 120 and gaps in the first circuit layers 120, so that the dielectric layers 110 surround the first circuit layers 120 and the chips 100.

In some embodiments, metal layers (not shown in the figure) may be formed on the dielectric layers 110 after the dielectric layers 110 are formed to facilitate subsequent formation of some other conductive components (such as the second circuit layers 150 shown in FIG. 5F) on the dielectric layers 110. A material of the metal layer may be varied depending on the some other conductive component on the dielectric layer 110. For example, if the second circuit layer 150 including copper metal is to be formed on the dielectric layer 110, the metal layer may be a titanium/copper layer formed by utilizing evaporation, sputtering, or electroless plating.

A description is provided with reference to FIG. 5E to FIG. 5F. In the embodiment where the circuit board 10 includes the second circuit layers 150, the method may include forming the second circuit layers 150 on the dielectric layers 110 after the dielectric layers 110 are formed. In greater detail, as shown in FIG. 5E, the dielectric layers 110 are first patterned to form dielectric layer openings 115. The dielectric layer openings 115 extend to an upper surface of each of the first circuit layers 120 so that the dielectric layer openings 115 expose part of the first circuit layers 120. For example, the dielectric layer openings 115 on the first circuit layers 120 may be formed by using laser drilling, and the laser drilling process stops on the upper surface of each of the first circuit layers 120. In the embodiments where the metal layers are included on the dielectric layers 110, patterning the dielectric layers 110 also includes patterning the metal layers on the dielectric layers 110.

Then, a conductive material is deposited on the dielectric layers 110 and in the dielectric layer openings 115 to respectively form the second circuit layers 150 and the blind vias 160. The blind vias 116 contact the upper surface of each of the first circuit layers 120, and the blind vias 160 and the second circuit layers 150 are the conductive material deposited continuously in a single step. Therefore, the second circuit layers 150 can be electrically connected to the first circuit layers 120 through the blind vias 160 in the dielectric layers 110. In some embodiments, since the blind vias 160 and the second circuit layers 150 are formed in the single step, the second circuit layer 150 and the blind via 160 can be integrally formed into one piece.

In some embodiments, the deposition process of the second circuit layers 150 and the blind vias 160 may be similar to that of the first circuit layers 120, for example, they may be copper metal layers or alloy layers formed by using evaporation, sputtering, electroplating, some other suitable deposition technique, or a combination thereof. Hence, the first circuit layer 120, the second circuit layer 150, and the blind via 160 may include a similar material. In the embodiments where the metal layers are included on the dielectric layers 110, the metal layers not covered by the conductive material of the second circuit layers 150 may be removed after the second circuit layers 150 are deposited to avoid unexpected conductive paths.

A description is provided with reference to FIG. 5G to FIG. 5J. The substrate 300 is removed to expose the chip pads 102 and the first traces 122. In greater detail, the substrate 300 and the first circuit layers 120 on it are separated, so that the chip pads 102 at an upper surface of each of the chips 100 and an upper surface of each of the first traces 122 are exposed. Since the chip pads 102 and the first traces 122 are exposed at the same time, a subsequently formed conductive connector (such as the conductive connector 130 shown in FIG. 5L) can directly contact the chip pads 102 and the first trace 122 to form a conductive path at a same level.

In some embodiments, removing the substrate 300 may include the following steps. First, a description is provided with reference to FIG. 5G. The release layers 310 and the metal layers 320 are separated. For example, the release layers 310 and the metal layers 320 can be separated by reducing the viscosity of the release layers 310 through illuminating or heating the release layers 310. As shown in FIG. 5G, when the steps shown in FIG. 5A to FIG. 5F are applied to two sides of the substrate 300, separating the release layers 310 and the metal layers 320 will generate two sets of circuit boards at an intermediate stage of the process. The subsequent process steps can be performed on the two sets of circuit boards, respectively.

A description is provided with reference to FIG. 5H. Before performing a subsequent process for a conductive material, the second circuit layer 150 is protected by a photoresist layer 400 to maintain the integrity of the second circuit layer 150. In greater detail, a photoresist material is deposited on the dielectric layer 110 and the metal layer 320, in which the photoresist material on the dielectric layer 110 covers the second circuit layer 150. The photoresist material on one of the dielectric layer 110 and the metal layer 320 is exposed depending on the type of photoresist material. Next, a developing process is utilized to remove the photoresist material on the metal layer 320 to form the photoresist layer 400 covering the second circuit layer 150.

A description is provided with reference to FIG. 5I. The metal layer 320 is removed to expose the dielectric layer 110 and the adhesive layer 104. In greater detail, the metal layer 320 may be removed by using an etching process that is selective to metallic material. After the metal layer 320 is removed, the upper surface of the first trace 122, an upper surface of the adhesive layer 104, and an upper surface of the dielectric layer 110 are exposed. Since the adhesive layer 104 has not been removed, the chip pads 102 are still covered by the adhesive layer 104. In some embodiments, the etching process for removing the metal layer 320 may also remove part of the first circuit layer 120, so that the upper surfaces of the adhesive layer 104 and the dielectric layer 110 are higher than the upper surface of the first trace 122 after removing the metal layer 320.

A description is provided with reference to FIG. 5J. The adhesive layer 104 is removed to expose the chip pads 102. In greater detail, the adhesive layer 104 on the chip 100 may be removed by using an etching process, such as plasma etching, to expose the whole upper surface of the chip 100 so as to expose the chip pads 102 at the upper surface of the chip 100. In some embodiments, since the upper surfaces of the adhesive layer 104 and the dielectric layer 110 are higher than the upper surface of the first trace 122, a suitable etching process may be selected to remove part of the dielectric layer 110 when removing the adhesive layer 104. As a result, the upper surface of the dielectric layer 110 is coplanar with the upper surface of the first trace 122, and the selected etching process basically does not damage the first trace 122.

In the above embodiment, removing the metal layer 320 and the adhesive layer 104 is performed individually in separate steps. In some other embodiments, the metal layer 320 and the adhesive layer 104 may be removed in a single step. In some embodiments, after removing the metal layer 320 and the adhesive layer 104, the upper surface of the chip 100, the upper surface of the first trace 122, and the upper surface of the dielectric layer 110 can be coplanar with each another, so that a conductive connector subsequently formed on the chip 100 and the first trace 122 can contact the chip 100 and the first trace 122 at the same time.

A description is provided with reference to FIG. 5K. A patterned photoresist 500 is formed on the upper surface of the chip 100 and the upper surface of the first trace 122. In greater detail, a photoresist material is deposited on the upper surface of the chip 100, the upper surface of the first trace 122, and the upper surface of the dielectric layer 110. The photoresist material is exposed and developed to form the patterned photoresist including a photoresist opening 505. As shown in FIG. 5K, the single photoresist opening 505 simultaneously exposes the chip pads 102 of the chip 100 and part of the upper surface of the first trace 122.

In some embodiments, a metal layer (not shown in the figure) may be formed on the upper surface of the chip 100, the upper surface of the first circuit layer 120, and the upper surface of the dielectric layer 110 before the patterned photoresist 500 is formed to facilitate subsequent formation of the conductive connector 130. A material of the metal layer may be varied depending on the conductive connector 130. For example, if the conductive connector 130 to be formed includes cupper metal, the metal layer may be a titanium/copper layer formed by utilizing evaporation, sputtering, or electroless plating. In the embodiments where the metal layer is formed, the photoresist opening 505 exposes the metal layer right above the chip pads 102 and part of the metal layer right above the first trace 122.

A description is provided with reference to FIG. 5L. The conductive connector 130 is formed in the photoresist opening 505. In greater detail, a conductive material is deposited in the photoresist opening 505 so that the conductive material defined by the photoresist opening 505 forms the conductive connector 130. Since the photoresist opening 505 exposes the chip pads 102 and part of the upper surface of the first trace 122 at the same time, a lower surface of the conductive connector 130 directly contacts the chip pads 102 and the upper surface of the first trace 122. After the conductive connector 130 is formed, the conductive connector 130 electrically connects the chip 100 and the first circuit layer 120, so that a conductive path at a same level is formed between the chip 100, the first circuit layer 120, and the conductive connector 130.

In some embodiments, a thickness of the conductive material deposited in the photoresist opening 505 may be smaller than a thickness of the patterned photoresist 500, so that a pattern of the conductive material is directly defined by the photoresist opening 505. In some embodiments, the conductive connector 130 and the first trace 122 may include a same metallic material to reduce a resistance difference between the conductive connector 130 and the first trace 122, and improve integrity of current signals during transmission.

A description is provided with reference to FIG. 5M. The patterned photoresist 500 is removed. In greater detail, a removal process may be performed on the patterned photoresist 500 by using, for example, a photoresist stripper, so that the conductive connector 130 remains on the chip 100 and the first circuit layer 120. In some embodiments, the process of removing the patterned photoresist 500 may also remove the photoresist layer 400 covering the second circuit layer 150, so that the second circuit layer 150 is exposed. In the embodiments where the metal layer is formed before the patterned photoresist 500 is formed, a flash etching process may be performed after the patterned photoresist 500 is removed to remove the metal layer not covered by the conductive connector 130, such as the metal layer on the chip 100 or the dielectric layer 110.

As mentioned above, the formation of the conductive connector 130 mainly includes forming the patterned photoresist 500 and depositing the conductive material in the photoresist opening 505 in the patterned photoresist 500. Overall speaking, the process steps of the conductive connector 130 are based on a photolithography process. Since the photolithography process can use a light source or equipment to form the small-sized photoresist opening 505, the photoresist opening 505 can precisely select the chip pads 102 to be exposed.

Therefore, using the photolithography method to form the conductive connector 130 also forms a chip-circuit layer connection with a small size and high precision, so that a greater number of conductive paths can be formed between the chip 100 and the first circuit layer 120. In other words, within a given chip area, the chip 100 can have a greater number of the chip pads 102, thus increasing the input/output (I/O) density of the chip 100 and improving the signal transmission efficiency of the circuit board 10.

A description is provided with reference to FIG. 5N. The insulating protection layer 140 is formed on the chip 100, the first circuit layer 120, and the conductive connector 130 so as to form the circuit board 10. In greater detail, an insulation material is deposited on the chip 100, the first circuit layer 120, and the conductive connector 130 after the conductive connector 130 is formed to avoid the phenomenon of short circuit, open circuit, etc., caused by external factors, such as scratches of multiple conductive components formed previously. In some embodiments, an opening exposing the chip 100 (such as the opening 145 shown in FIG. 3A) may be formed in the insulating protection layer 140, so that the chip pads 102 that are not in contact with the conductive connector 130 are exposed for connecting to some other circuit board or component.

According to the above embodiments of the present disclosure, the circuit board with the embedded chip according to the present disclosure includes the first circuit layer and the chip in the same dielectric layer, the conductive connector on the chip and the first circuit layer, and the insulating protection layer on the chip, the first circuit layer, and the conductive connector. The conductive connector contacts the chip pads of the chip and the first trace of the first circuit layer, so that the chip, the first circuit layer, and the conductive connector form the conductive path at a same level of the circuit board, thus reducing the number of circuit layers required for the circuit board to achieve the effect of thinning the circuit board. The conductive connector can further reduce the number of boundaries between the chip and the first circuit layer, thus reducing losses or noises of current signals in the circuit board with the embedded chip.

In addition, according to the above embodiments of the present disclosure, the method of manufacturing the circuit board with the embedded chip according to the present disclosure uses the photolithography process to form the conductive connector. Since the photolithography process can form the conductive connector with a small size and high positional precision, the chip can be formed with a large number of inputs/outputs through the conductive connector and the circuit layer. As a result, the chip in the circuit board can have a high density of chip pads to improve the signal transmission efficiency in the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board with an embedded chip comprising:
a dielectric layer;
a first circuit layer comprising at least one first trace in the dielectric layer;
a first chip in the dielectric layer and adjacent to the first trace, wherein the first chip comprises a plurality of first chip pads located at an upper surface of the first chip;
a first conductive connector on the upper surface of the first chip and an upper surface of the first trace, wherein a lower surface of the first conductive connector contacts at least one of the first chip pads and the upper surface of the first trace; and
an insulating protection layer on the first chip, the first circuit layer, and the first conductive connector, wherein the insulating protection layer directly contacts the upper surface of the first chip, an upper surface and sidewalls of the first conductive connector, the upper surface of the first trace, and an upper surface of the dielectric layer.

2. The circuit board with the embedded chip of claim 1, wherein the first conductive connector contacts the dielectric layer between the first chip and the first trace.

3. The circuit board with the embedded chip of claim 1, wherein a thickness of the insulating protection layer is greater than a thickness of the first conductive connector.

4. The circuit board with the embedded chip of claim 1, wherein a sidewall of the first conductive connector is laterally separated from the first chip pad in contact with the first conductive connector.

5. The circuit board with the embedded chip of claim 1, wherein the upper surface of the first chip, the upper surface of the first trace, and an upper surface of the dielectric layer are coplanar with one another.

6. The circuit board with the embedded chip of claim 1, wherein the first conductive connector and the first trace comprise a same metallic material.

7. The circuit board with the embedded chip of claim 1, wherein the insulating protection layer comprises an opening, the opening exposes at least one of the first chip pads.

8. The circuit board with the embedded chip of claim 7, further comprising a second chip located above the insulating protection layer, wherein the second chip is electrically connected to the first chip by the first chip pad exposed by the opening.

9. The circuit board with the embedded chip of claim 8, further comprising a solder bump filled into the opening, wherein the solder bump contacts the second chip and the first chip pad exposed by the opening.

10. The circuit board with the embedded chip of claim 1, wherein the insulating protection layer comprises an opening, the opening exposes part of the first circuit layer.

11. The circuit board with the embedded chip of claim 1, further comprising:
a second chip located in the dielectric layer and adjacent to the first chip, wherein the second chip comprises a plurality of second chip pads at an upper surface of the second chip; and
a second conductive connector on the upper surface of the first chip and on the upper surface of the second chip, wherein a lower surface of the second conductive connector contacts the first chip pads of the first chip and the second chip pads of the second chip.

12. The circuit board with the embedded chip of claim 11, wherein a plurality of sidewalls of the second conductive connector are laterally separated from the first chip pads of the first chip and the second chip pads of the second chip.

13. The circuit board with the embedded chip of claim 11, wherein a boundary between the first chip and the second conductive connector is coplanar with a boundary between the second chip and the second conductive connector.

14. The circuit board with the embedded chip of claim 11, further comprising:
a second circuit layer under the dielectric layer, wherein the second circuit layer is electrically connected to the first circuit layer through at least one blind via in the dielectric layer.

15. A method of manufacturing a circuit board with an embedded chip comprising:
forming a first circuit layer and a chip on a substrate, wherein the chip is adjacent to a first trace in the first circuit layer;
forming a dielectric layer covering the first circuit layer and the chip;
removing the substrate so that a plurality of chip pads at an upper surface of the chip and an upper surface of the first trace are exposed;
forming a patterned photoresist on the upper surface of the chip and the upper surface of the first trace, wherein the patterned photoresist comprises at least one photoresist opening that exposes at least one chip pad of the chip pads and part of the upper surface of the first trace;
forming a conductive connector in the photoresist opening, wherein the conductive connector contacts the chip pad and the upper surface of the first trace exposed by the photoresist opening;
removing the patterned photoresist; and
forming an insulating protection layer on the chip, the first circuit layer, and the conductive connector, wherein the insulating protection layer directly contacts an upper surface of the chip, an upper surface and sidewalls of the conductive connector, the upper surface of the first trace, and an upper surface of the dielectric layer.

16. The method of claim 15, wherein forming the first circuit layer and the chip on the substrate comprises:
forming a release layer on the substrate and a metal layer on the release layer;
forming the first circuit layer on the metal layer; and
disposing the chip on the metal layer by an adhesive layer, wherein the chip pads contact the adhesive layer.

17. The method of claim 16, wherein removing the substrate to expose the chip pads and the first trace comprises:

separating the release layer and the metal layer;

removing the metal layer so that the upper surface of the first trace and the adhesive layer are exposed; and removing the adhesive layer so that the chip pads are exposed.

18. The method of claim 15, further comprising:

forming at least one opening in the insulating protection layer, wherein the opening exposes the chip pads not covered by the conductive connector.

19. The method of claim 15, further comprising:

patterning the dielectric layer after the dielectric layer is formed and before the substrate is removed to form at least one dielectric layer opening so as to expose part of the first circuit layer; and depositing a conductive material on the dielectric layer and in the dielectric layer opening to form a second circuit layer and at least one blind via electrically connected to the first circuit layer.

20. The method of claim 19, further comprising:

forming a photoresist layer on the dielectric layer, wherein the photoresist layer covers the second circuit layer; and removing the photoresist layer when the patterned photoresist is removed.

* * * * *